United States Patent [19]

Osborne

[11] Patent Number: 5,107,107
[45] Date of Patent: Apr. 21, 1992

[54] LASER OPTICAL DISK POSITION ENCODER WITH ACTIVE HEADS

[75] Inventor: Eric P. Osborne, Bowie, Md.

[73] Assignee: The United States of America as represented by the Administarator of the National Aeronautics and Space Administration, Washington, D.C.

[21] Appl. No.: 506,636

[22] Filed: Mar. 30, 1990

[51] Int. Cl.⁵ .............................................. G01D 5/34
[52] U.S. Cl. .............................. 250/231.14; 369/44.26
[58] Field of Search ................... 250/231.14, 231.16, 250/237 G; 341/13; 356/356, 355, 359, 369; 369/44.11, 44.26, 121

[56] References Cited

U.S. PATENT DOCUMENTS

| | | | |
|---|---|---|---|
| 2,694,804 | 11/1954 | Wagner | 340/282 |
| 2,995,705 | 8/1961 | Walker et al. | 324/70 |
| 4,110,610 | 8/1978 | Mueller et al. | 250/231 SE |
| 4,339,198 | 7/1982 | Leuchter, Jr. | 356/144 |
| 4,387,299 | 6/1983 | Akiyama | 250/231.14 |
| 4,544,915 | 10/1985 | Wieme et al. | 340/347 P |
| 4,639,595 | 1/1987 | Okita et al. | 250/231.14 |
| 4,644,156 | 2/1987 | Takahashi et al. | 250/231.14 |
| 4,644,157 | 2/1987 | Ozawa et al. | 250/231.14 |
| 4,659,924 | 5/1987 | Tokunaga | 250/231 SE |
| 4,661,696 | 5/1987 | Stone | 250/231 SE |
| 4,673,810 | 6/1987 | Babsh et al. | 250/237 G |
| 4,823,000 | 4/1989 | Onyon | 250/237 G |

OTHER PUBLICATIONS

Applicant Eric P. Osborne, "A Theoretical Comparison: Rotary Encoders with Fixed Read Stations & Those with Moving Heads," a Master's Thesis Submitted to the University of Maryland School of Mechanical Engineering in Apr. 1989.

*Primary Examiner*—David C. Nelms
*Assistant Examiner*—S. Allen
*Attorney, Agent, or Firm*—R. Dennis Marchant; John R. Manning; Paul S. Clohan

[57] ABSTRACT

An angular position encoder is provided that minimizes the effects of eccentricity and other misalignments between the disk and the read stations by employing heads which incorporate beam steering optics with the ability to actively track the disk in directions along the disk radius and normal to its surface. The device adapts features prevalent in optical disk technology toward the application of angular position sensing. A reflective disk and the principles of interferometry are employed. The servo controlled steering optics move so as to acquire a track on the disk lying at a predetermined radius and distance below the head, and then adjust position and orientation in order to maintain view of the disk track as required. Thus, the device is actively self-aligning.

12 Claims, 13 Drawing Sheets

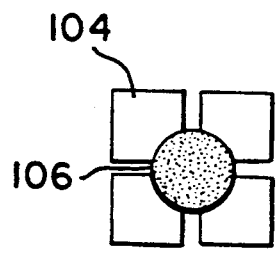
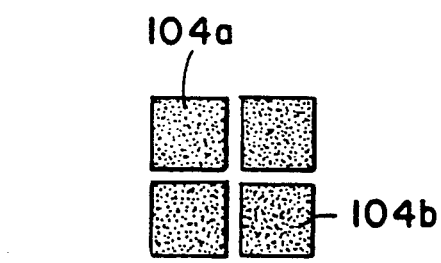
FIG.11a
FIG.11d
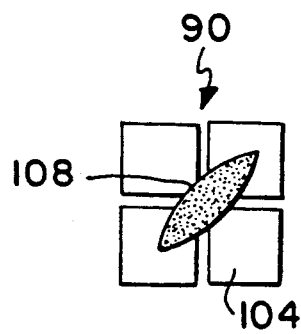
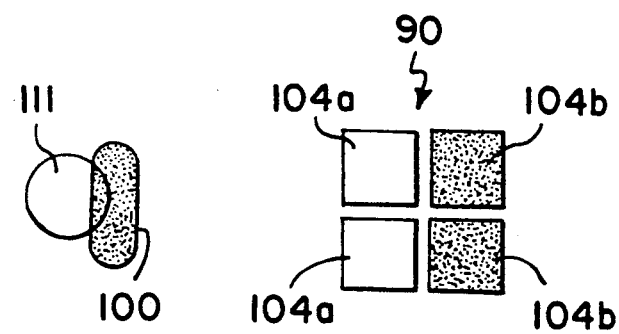
FIG.11b
FIG.11e
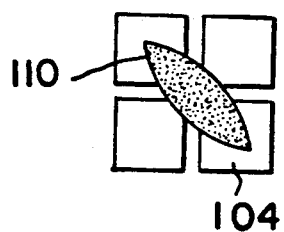
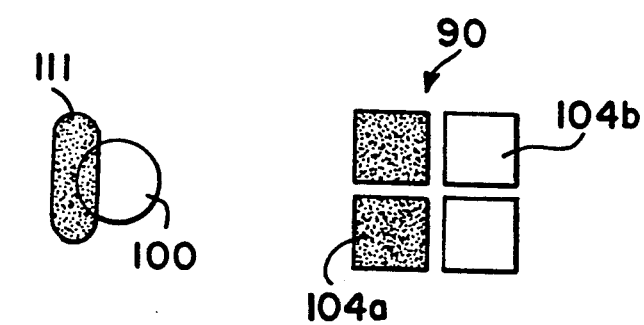
FIG.11c
FIG.11f

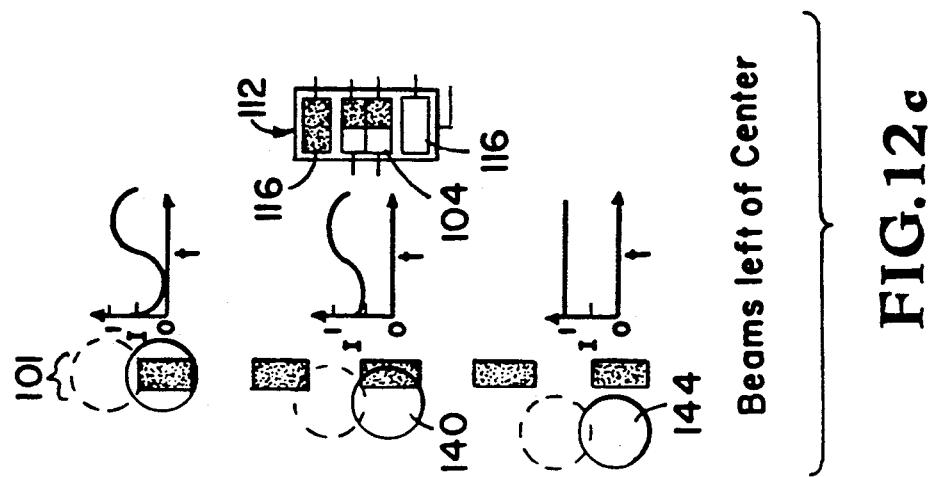
FIG. 12c Beams left of Center
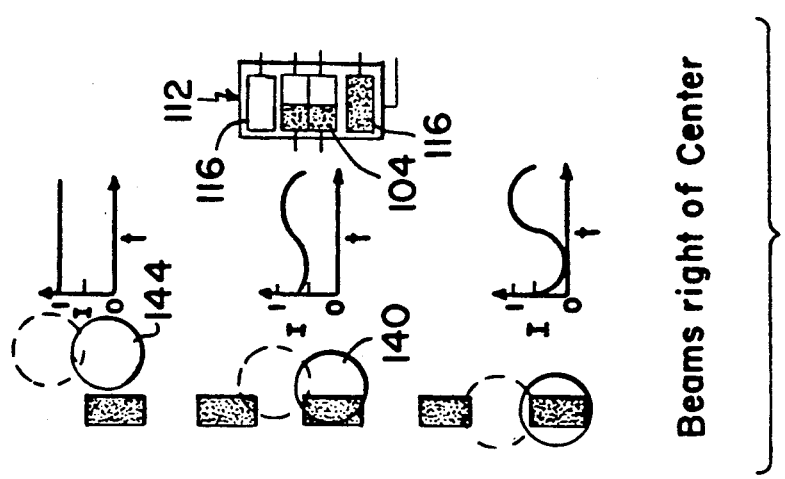
FIG. 12b Beams right of Center
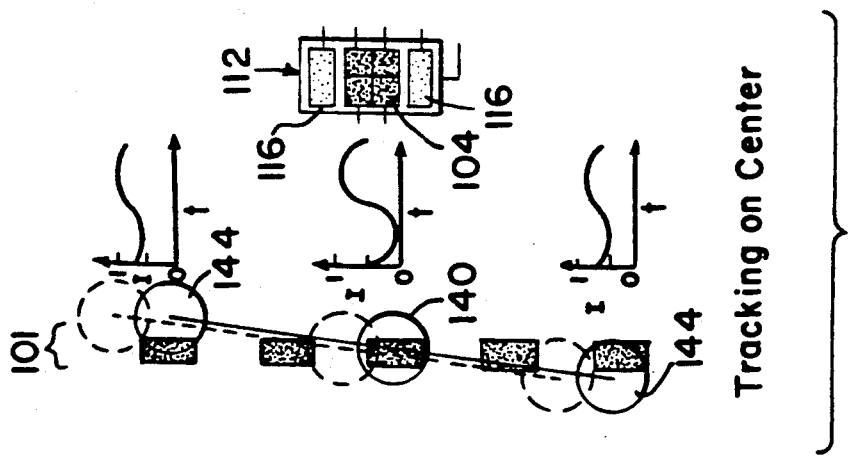
FIG. 12a Tracking on Center

ENLARGED DETAIL

LASER OPTICAL DISK POSITION ENCODER WITH ACTIVE HEADS

ORIGIN OF THE INVENTION

The invention described herein was made by an employee of the U.S. Government and may be manufactured and used by or for the Government for governmental purposes without the payment of any royalties thereon or therefor.

TECHNICAL FIELD

The invention relates in general to optical shaft encoders and more particularly to an optical disk encoder system in which the sensor heads incorporate beam steering optics so as to actively track the encoder disk.

BACKGROUND ART

Rotary optical encoders are often used to measure the angular position of a motor shaft. Presently known conventional devices employ optical detectors to monitor the motion of a disk that is attached to the motor shaft. The optical detectors and an associated light source are mounted within read stations, or heads, which are fixed or locked in a stationary position with respect to the encoder housing. Typically the disk has a series of light and dark lines encoded on its surface which are illuminated in the region of the optical detectors by the light source. The portion of the disk thus demarcated is referred to as the track. As the illuminated disk rotates beneath the detectors, the amount of illumination impinging on their surfaces fluctuates. The amount of shaft rotation is determined by counting the number of intensity fluctuation sensed by the detector. Since the angular width of the lines is known at a particular radius on the disk, the arclength viewed by the head and the associated angular rotation of the disk may be determined.

There are fundamentally three optical arrangements which can be used. The most common is a transmissive scheme wherein opaque lines are encoded on a transparent disk. The light source is placed opposite the optical detectors with the disk rotating between the two. In order to enhance contrast, a mask between the disk and the detectors may be employed and collimating optics may be used.

A second approach is to place the detectors and the light source on the same side of the disk. In this reflective scheme, the disk is constructed such that it reflects varying amounts of light back to the detectors. A variation on this scheme involves applying the principles of interferometry. The disk is grooved such that the stripes on the disk lie in two planes differing by a fraction of a wavelength of light. A third approach is similar but is based upon principles of diffraction and interferometry. In this approach the disk is constructed such that it acts as a diffraction grating.

One limitation of conventional rotary encoders is their sensitivity to eccentricities in the disk or shaft relative to the detectors. These cause the radius from the center of rotation to the portion of the track being observed by the read stations to vary. In order to properly interpret the fluctuations in illumination in terms of arclength, one must have knowledge of the instantaneous radius throughout the sweep of the disk. Otherwise, the calculated or perceived rotation will deviate from the actual rotation. Given that the conventional encoder has fixed heads, this deviation cannot be accounted for by the individual heads. In order to minimize sensitivity to this phenomenon, multiple heads are often used and the detected signals are averaged. If, however, the encoder track being monitored should deviate to such an extent that it lies outside the detector's field of view, no motion of the disk will be detected. Thus, eccentricity has a significant effect on accuracy.

The encoder device disclosed herein minimizes the effects of eccentricity and other misalignments between the disk and the read stations by employing heads which incorporate beam steering optics with the ability to actively track the disk in directions along the disk radius and normal to its surface. The design of the device is such that it employs a reflective disk and the principles of interferometry. The servo controlled steering optics will move so as to acquire a track on the disk lying at a predetermined radius and distance below the head, and then adjust position and orientation in order to maintain view of the disk track as required. Thus, the device will be actively self-aligning.

The precision bearings used in conventional encoders to align the disk relative to the read stations are no longer necessary. Consequently, the costs associated with precision assembly are reduced. The load path through the bearings is eliminated, thereby preventing loads on the encoder shaft from deforming the disk which leads to errors in encoder accuracy. Modular encoders, which are a special type of conventional encoder, also have this feature, but their accuracies are limited by the alignment attainable during installation of the device. The present invention is far less sensitive to these alignments provided certain conditions are met at assembly which shall be discussed in more detail in what follows. The possibility of loss of view of the track is far less of a concern as well because the steering optics can accommodate large excursions of the track.

This invention is an adaptation of Compact Disc (CD) or Laser Optical Disk (LOD) technology and consequently affords some features that conventional encoders cannot provide. Since it is based on this technology, the device takes advantage of the high bit density achievable on CD or LOD which is equivalent to having available extremely fine line widths. This is significant because the closer together one can pack these lines, the greater the achievable resolution of angular motion at a particular radius. The present device should be easily adaptable to other types of mass storage media, such as magnetic disks, magneto-optic disks and electron trapping optical disks. The technique is, thus, adaptable to the media offering the greatest bit density at any point in the evolution of mass storage devices.

A particular advantage of using the laser optical disk and the associated optics incorporated in the present invention is that the laser optical disk is unaffected by normal surface deterioration since the surface which is being optically read is sandwiched between a protective coating and a thick substrate material. Accordingly, the encoder described herein will be less sensitive to dust and contaminants than are high resolution optical encoders of conventional design which employ surface plated disks.

STATEMENT OF THE INVENTION

It is therefore an object of the present invention to provide an improved rotary optical encoder with actively tracking heads for rotary position sensing.

It is another object of the present invention to provide a device for rotary position sensing which utilizes standard mass storage media that is based on optical disk or compact disk (CD) technology.

It is a further object of this invention to provide a method for the application of angular position sensing by use of optical disk or compact disc (CD) and the associated optics which track a plane of focus within the disc.

It is still another object of the present invention to provide a low cost, high resolution encoder that will accurately measure the rotary motion of a shaft or disc even when some eccentricities and misalignments are present in the disc or shaft.

It is still a further object of this invention to provide a rotary optical encoder which is less sensitive to static misalignment arising during assembly and installation of the device and dynamic misalignment arising during operation as a consequence of radial and axial play.

It is further an object of this invention to adapt a modular design for precision encoding which incorporates no internal bearings thereby eliminating concerns regarding errors related to warping of the disk due to shaft loading, concerns about bearing service life limitations, and concerns about bearing generated debris and outgassing of the associated lubricants which may be sufficient to impair optical performance in a vacuum environment.

It is still another object of this invention to provide greater resolution in a smaller package than conventional designs through the application of laser optical disks or other alternative mass media disk constructions.

Another object of this invention is to provide an encoder less sensitive to disk surface contamination, again through the application of laser optical disks or other alternative disk constructions.

These and other objects are accomplished in a rotary optical encoder wherein, in its simplest form, the device consists of a disk encoded with laser pits spaced at even intervals defining circumferential tracks, and an optical read station incorporating a collimated coherent light source, a detector array, and servo controlled beam steering optics. The disk is illuminated, the pits on its surface are sensed via the photo detector array, and the servo controlled optics are kept aligned in the fashion of optical disk drives and Compact Disk players.

In the preferred embodiment of this invention, two read stations are employed. These are positioned diametrically opposed to one other within the encoder body. The two are aligned such that the planes defined by the focus and track directions of motion of each set of steering optics are coplanar.

The disk is a laser optical disk on which the track region is delineated by two guard bands lying at some inner and outer diameter of the disk. These are continuous pits running the full circumference of the disk and having a width on the order of the wavelength of light used in the particular setup. Within the region defined by the guard bands are data tracks which consist of pits spaced at even intervals. The central track in the track region is divided into some maximum number of intervals to be defined by disk manufacturing limits and the photodetector feedback algorithm employed. The spacing of the intervals increases with each consecutive track as one moves toward either of the two guard bands. This arrangement allows for acquisition of the central track by both heads regardless of initial radial position through evaluation of the interval spacing during dithering or rotation of the encoder disk at a constant rate during setup. Thus, the disk radius is fixed, known and identical for both heads.

Once the device has been setup as described, it is used just as the conventional encoder. The variations in two detector array signals, one coming from each read station, are averaged and interpreted as angular rotations.

The beam steering optics include movable and stationary portions. The movable portion consists of an amorphic objective lens which is mounted on a bobbin whose position and orientation is controlled by magnetic coils. The bobbin is supported by a flexible diaphragm. The amorphism in the lens changes the shape of the returning reflected beam as a function of focal length. This distortion of the beam causes focal length dependent variations in the illumination of individual elements of the optical detector. Using differential amplifiers these variations are used to generate feedback signals to the magnetic coils such that the proper focal length is maintained.

The static elements of the beam steering optics includes a beam splitting arrangement which directs the light beam toward the disk and redirects the reflected beam toward the optical detector. A second static element is a diffraction grating which breaks two flanking beams off the main beam before it strikes the disk. The two beams lie in the same plane as the main beam, but the grating is oriented such that the plane thus defined strikes the disk slightly skew of the tangent to the track being observed. Thus, the two flanking beams strike the track forward and aft of the main beam, and left and right of it.

The detector array includes two flanking elements which receive the reflections generated by these flanking beams. The radial position of the track relative to the main beam may be determined using differential amplifiers which compare the level of illumination falling on each of the two flanking elements. Thus, error signals are generated and fed back to the magnetic coil which governs the radial position of the beam steering optics. Auxiliary tracking error information is also derived by evaluating the distribution of the illumination on the 4 central elements of the photo detector.

BRIEF DESCRIPTION OF DRAWINGS

FIGS. 11a, 11b and 11c illustrate the servo feedback signals pertaining to focus error.

FIGS. 11d, 11e and 11f illustrate the servo feedback signals pertaining to tracking error.

FIGS. 12a, 12b and 12c depict the three beam tracking method for providing tracking feedback.

FIG. 17b is an exploded view showing track details of the disk shown in FIG. 17a.

DETAILED DESCRIPTION OF THE INVENTION

Technical Discussion

Prior to delving into the precise construction of the invention, it is first necessary to discuss the particulars of both conventional rotary encoders and optical disk technology. This is due to the synergistic nature of the invention described herein which combines two unique technologies. Both of these technologies must be understood in order to properly understand the construction and intent of the invention.

Conventional Encoders

Figure 1:
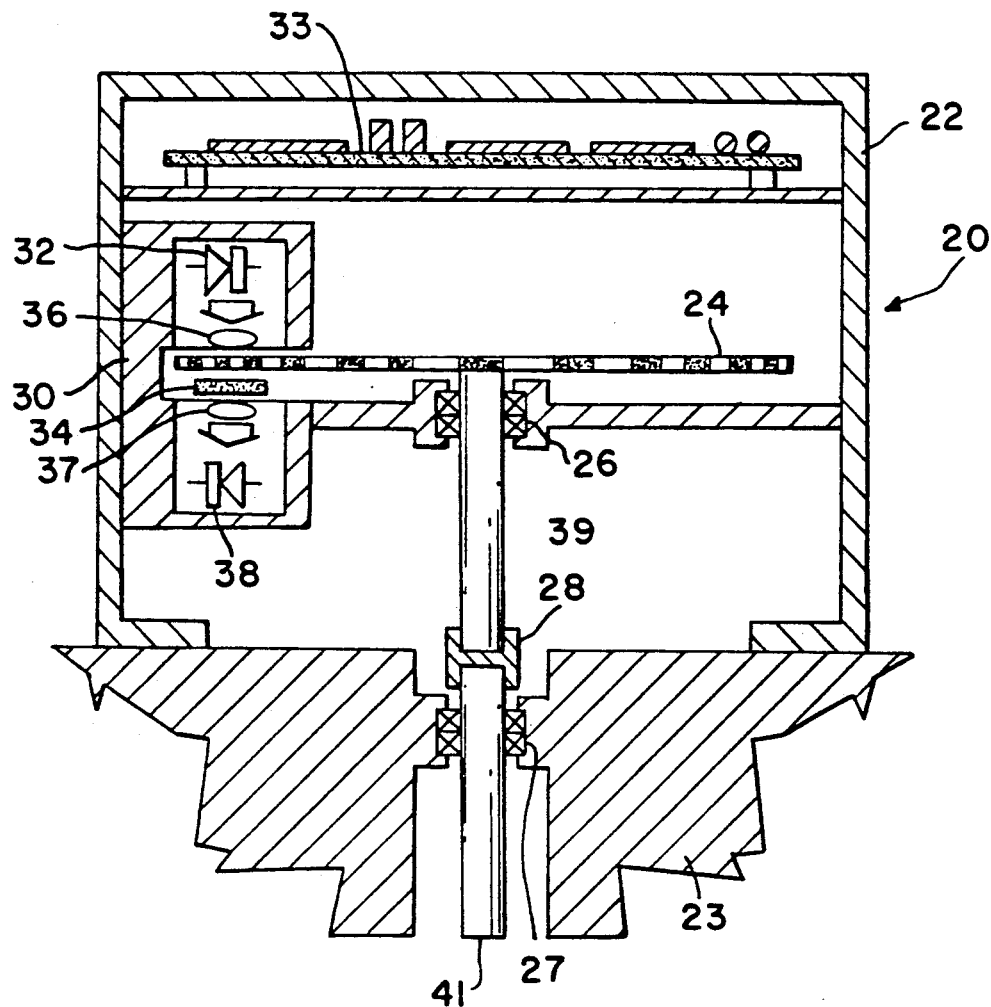
FIG. 1 is a cross-sectional view of a conventional optical encoder.
Figure 2:
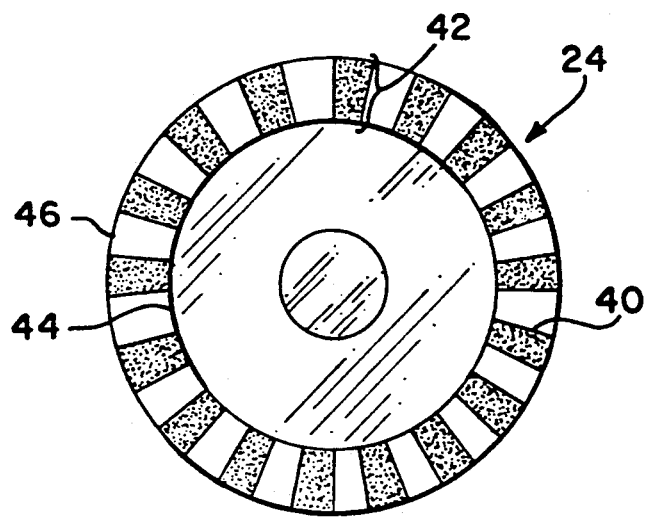
FIG. 2 is a plan view of a simple incremental encoder disk.
Figure 3:
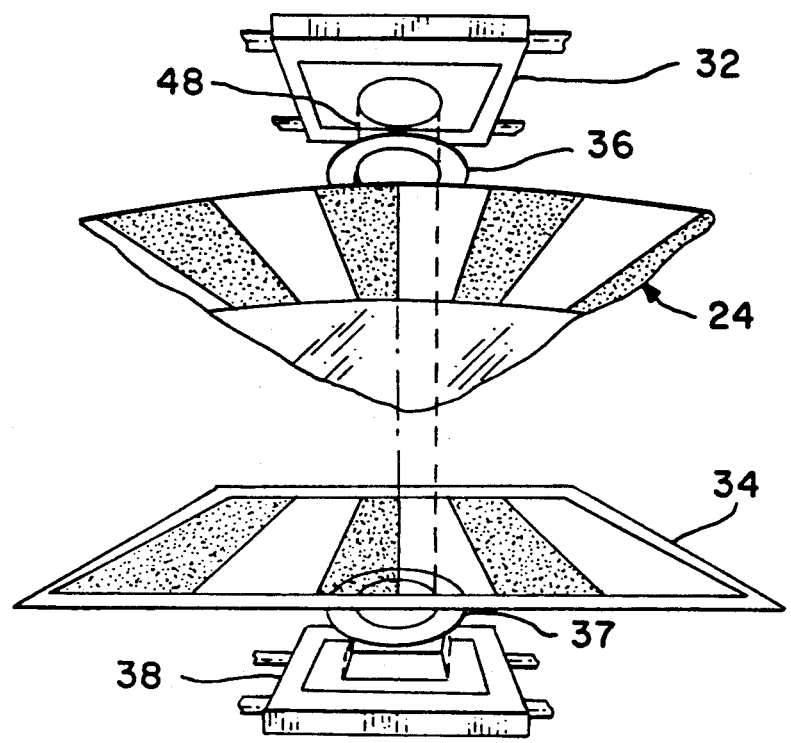
FIG. 3 is an end on view of the beam path of the transmissive optics of a conventional encoder.

The principles of operation describing the function of a conventional rotary optical encoder have already been discussed, but will briefly be reviewed now. FIG. 1 depicts a cross section of a conventional rotary optical encoder 20 which employs a transmissive optical approach. The encoder consists of a body 22, a disk 24, a disk alignment bearing 26, a shaft coupling 28, and a read station 30 which includes a light source 32, a mask 34, lenses 36 and 37, and a detector 38. Encoded on the surface of the transparent disk 24 is a series of opaque lines 40 running in the radial direction as shown in FIG. 2. These lines form a circular track 42 bounded by an inner radius 44 and an outer radius 46. The light source 32 (as shown in FIG. 1) lies on one side of the disk 24 in the region of the track 42 while the detector 38 lies on the opposite side of the disk 24. As depicted in FIG. 3, the light beam 48 emitted by the source 32 passes through one lens 36, then the disk 24 (to the extent possible depending upon disk alignment), through the mask 34 and accompanying lens 37, and finally strikes the detector 38. As the encoder shaft 39 (as shown in FIG. 1) rotates, the detector 38 senses the changing illumination and generates a signal which varies in proportion to disk 24 orientation in a periodic fashion.

Figure 4:
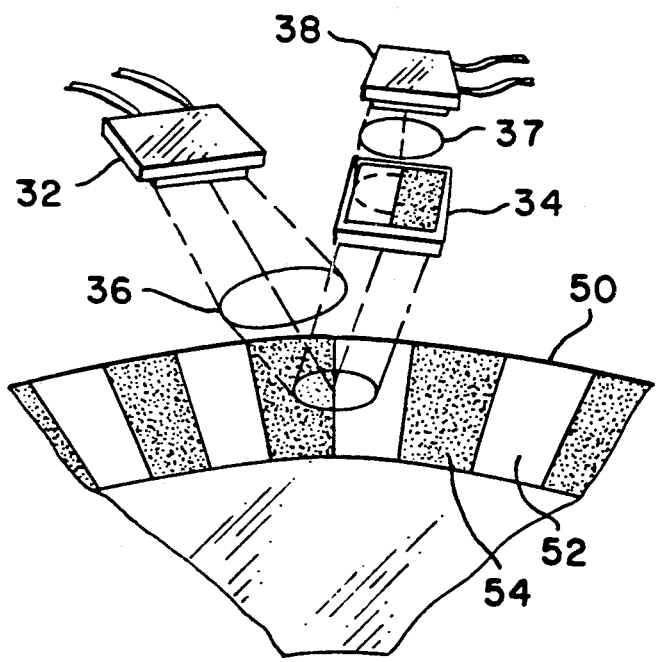
FIG. 4 is a schematic of a conventional encoder employing the reflective optical approach.

With regard to the optical approach used, two alternative constructions are possible. Reflective or diffraction based schemes may be used rather than a transmissive scheme. In a typical reflective scheme as shown in FIG. 4, the reflective disk 50 is encoded with alternating regions of high reflectivity 52 and low reflectivity 54. The light source 32, lenses 36 and 37, mask 34, and the detector 38 are placed on the same side of the disk 50.

Figure 5:
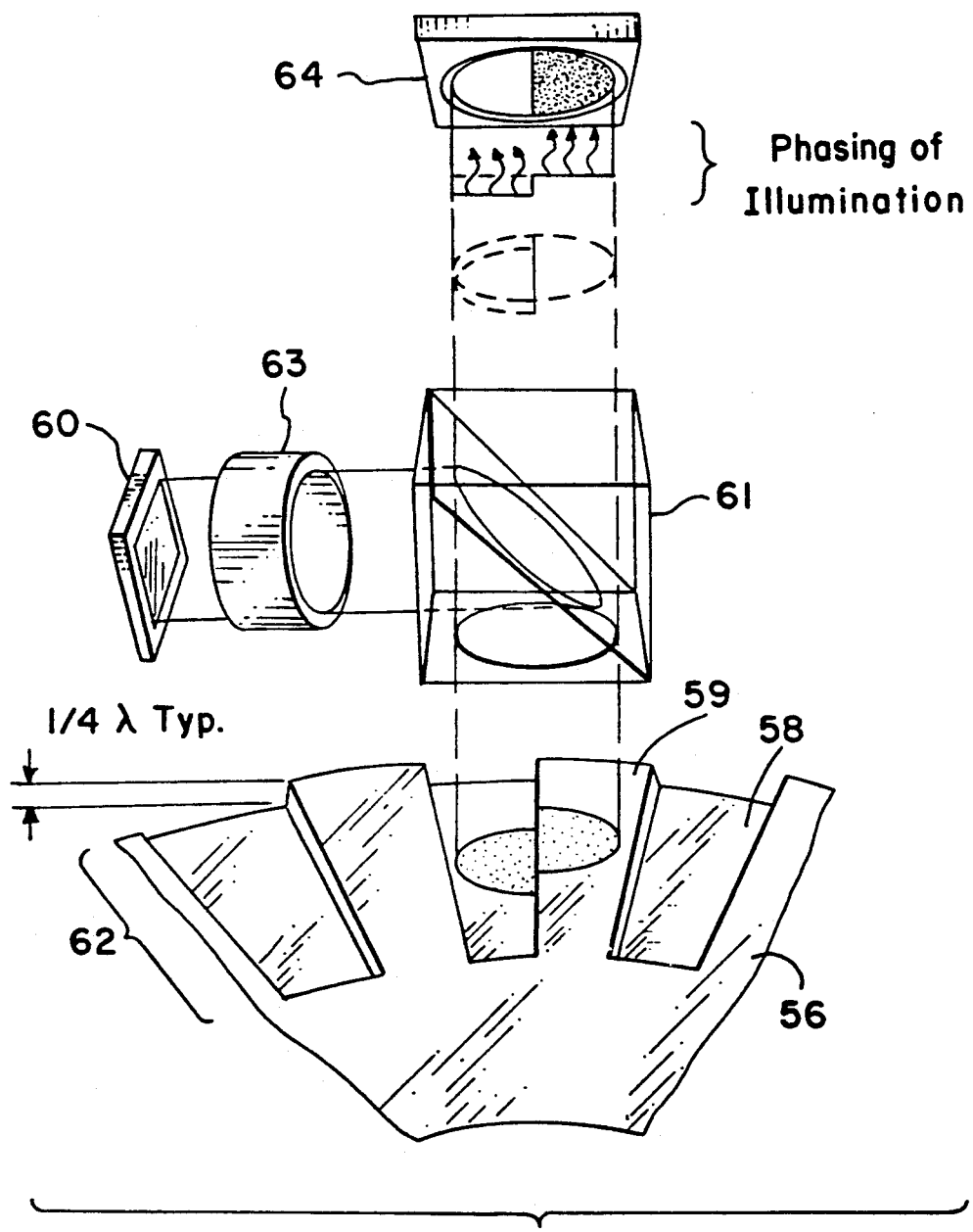
FIG. 5 is a schematic of a conventional encoder employing the reflective interferometric approach.

A more sophisticated approach involves application of the principles of interferometry. This concept is depicted in FIG. 5. The bilevel disk 56 employed in this case has a constant reflectivity, but it is grooved such that the alternating stripes or regions 58 and 59 on the disk 56 lie in two planes differing in height by a fraction of a wavelength of light. A coherent light source 60 positioned above the disk 56 is used to illuminate the disk track 62. A photo detector 64 lies on the same side of the disk 56 and is also fixed at some height above the disk. The light from the source 60 passes through the collimating lens 63, is reflected onto disk 56 by beam splitter 61 and is reflected back through beam splitter 61 to the detector 64. The distance travelled by the light beam is governed by whether the stripe 58 or 59 being illuminated lies in the upper plane or the lower plane of the disk 56.

When a single stripe 58 or 59 lies within the field of view of the detector 64, all the light striking the detector 64 is in phase. When a transition occurs in which portions of two adjacent stripes 58 and 59 are visible simultaneously, there is a substantial decrease in the intensity of the reflected beam. The reason for this is that the beam consists of two components which have travelled distances differing by a fraction of a wavelength before arriving at the detector 64. Since all the light leaves the source 60 in phase, the two components are out of phase when they strike the detector 64. Constructive interference occurs, and the intensity of the reflected light drops. Thus, the intensity of the light falling on the detector 64 varies as the disk 56 is rotated.

Some encoders combine the principles of diffraction and interferometry to sense the rotation of a shaft. The disk in this case is constructed such that it acts as a diffraction grating. The diffracted light may be produced by using a transmissive disk having very narrow radial slits. Although this approach is similar to that described for the reflective interferometric case, the two approaches should not be confused.

In order to simplify the descriptions of encoders employing the transmissive and reflective disk constructions, only incremental type encoders have been considered. These are the simplest form of optical encoder in which the disk employed is divided by stripes of equal width over its entire circumference. As the disk rotates, every cycle of variation in the illumination intensity is proportional to an angle defined by the track radius and the width of the stripes. Starting at some reference orientation, the encoder electronics 33, as shown in FIG. 1, simply count the number of pulses generated by the detector, and compute the angular rotation in proportion to the number of pulses registered.

Multiple read stations evenly spaced around the disk are typically used in the higher resolution devices to allow averaging out of the effects of disk wobble and warp. Multiple tracks and read stations placed out of phase with respect to one another are commonly used for sensing direction of rotation, and performing electronic interpolation of disk orientation.

An alternative to the incremental encoder is the absolute encoder in which a specially coded disk is used to provide absolute orientation data. These encoders have multiple read stations aligned along the radius of the disk. The disk used has multiple concentric tracks corresponding to these read stations. In the transmissive embodiment of the device, transparent and opaque regions on the disk are arranged such that a unique binary signature is viewed by the read stations for each discrete orientation of the disk. Analogous constructions using reflective or diffractive disks are possible, although they are not used in practice.

Figure 6B:
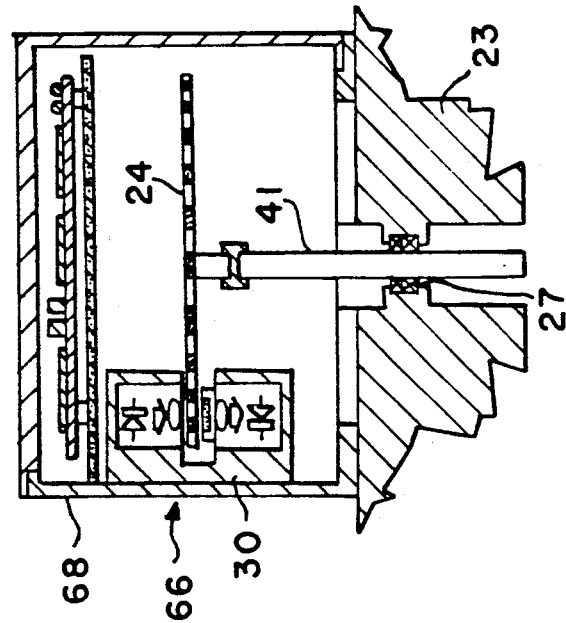
FIG. 6b is a cross-sectional view of a modular conventional encoder unit.
Figure 6A:
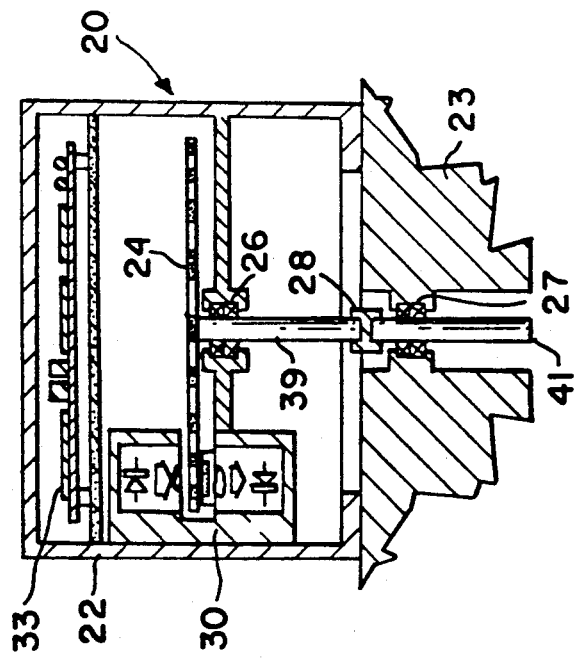
FIG. 6a is a cross-sectional view of a pre-assembled conventional encoder unit.

Two types of encoder constructions are available. One may choose between pre-assembled encoders and kit, or modular, encoders. FIGS. 6a and 6b depict the two types of encoders. Pre-assembled units as shown generally in FIG. 6a at 20 contain all components internally. The unit includes its own encoder shaft 39 to which the disk 24 in affixed internally. At installation, the shaft of interest or subject shaft 41 is attached to the encoder shaft 39 via a shaft coupling 28, and the body 22 of the encoder 20 is bolted to the shaft housing 23 simultaneously. The shaft of interest 41 is supported by shaft bearing 27.

The modular encoder 66 as shown in FIG. 6b consist of two independent pieces; the disk 24, and the encoder body 68 which includes the read station 30 and the associated components. In this case the disk 24 is coupled to the subject shaft 41 independent of the encoder body 68. The encoder body 68 is then placed over top of it. Generally some provision is provided for adjusting the relative position of the disk 24 with respect to the shaft 41 as well as the relative position of the encoder body 68 with respect to the disk 24. The ability to align these components relative to one another directly influences the accuracy achievable.

The advantage of the pre-assembled unit 20 as shown in FIG. 6a is that the alignment of the optics with respect to disk 24 is maintained by a bearing 26 internal to the encoder 20. The manufacturer has the tools to ensure that this alignment meets tight tolerances. The alignment of the encoder shaft 39 to the subject shaft 41, however, is the responsibility of the user. In many applications involving devices such as computer printers, slight misalignment is tolerable because the demands for accuracy and high resolution are not great. On the other hand in many military and aerospace applications, accuracy is crucial. For instance, a radar installation's pointing requirements are quite high. In such cases, great care must be taken to not only align the encoder shaft 39 to the subject shaft 41, but to ensure that no loads are passed through the encoder bearings 26 due to relative motion of the two shafts 39 and 41. Such loads may introduce misalignment, or worse yet, lead to deformation of the disk 24 and other anomalies.

The modular encoder 66 offers the advantage of being relatively inexpensive, and insensitive to external loads because it employs no internal bearings. Since it employs no additional bearings, one may argue that it is inherently more reliable. It also requires no internal lubrication which is an important plus for applications in clean, low pressure and/or vacuum environments. The chief disadvantage of this type of encoder is that the alignment of the encoder body 68 relative to the disk 24 is the user's responsibility. Accordingly, modular encoders 66 are not used in high resolution applications. It should also be noted that high resolution encoders generally have smaller optical paths which are more easily fouled by contaminants. Thus, it is usually impractical to allow assembly of high resolution encoders by the end user where the environment is more likely to be uncontrolled.

Optical Disk Technology

Optical disk technology involves the storage and retrieval of data from a disk through the use of lasers. An embodiment of this technology with which most persons are familiar is Compact Disc, or CD, technology. Compact Disc is a tradename for a particular class of optical disk which is used for the storage and retrieval of music. Other variants of optical disk technology are also available such as Read Only Memory (CD-ROM) disks, Write-Once-Read-Many-times (WORM) disks, and erasable Magneto-Optic (MO) disks. All can be used to store vast catalogs of data in a small space. Drives which handle these types of optical disks are currently being sold as computer peripherals.

Figure 7:
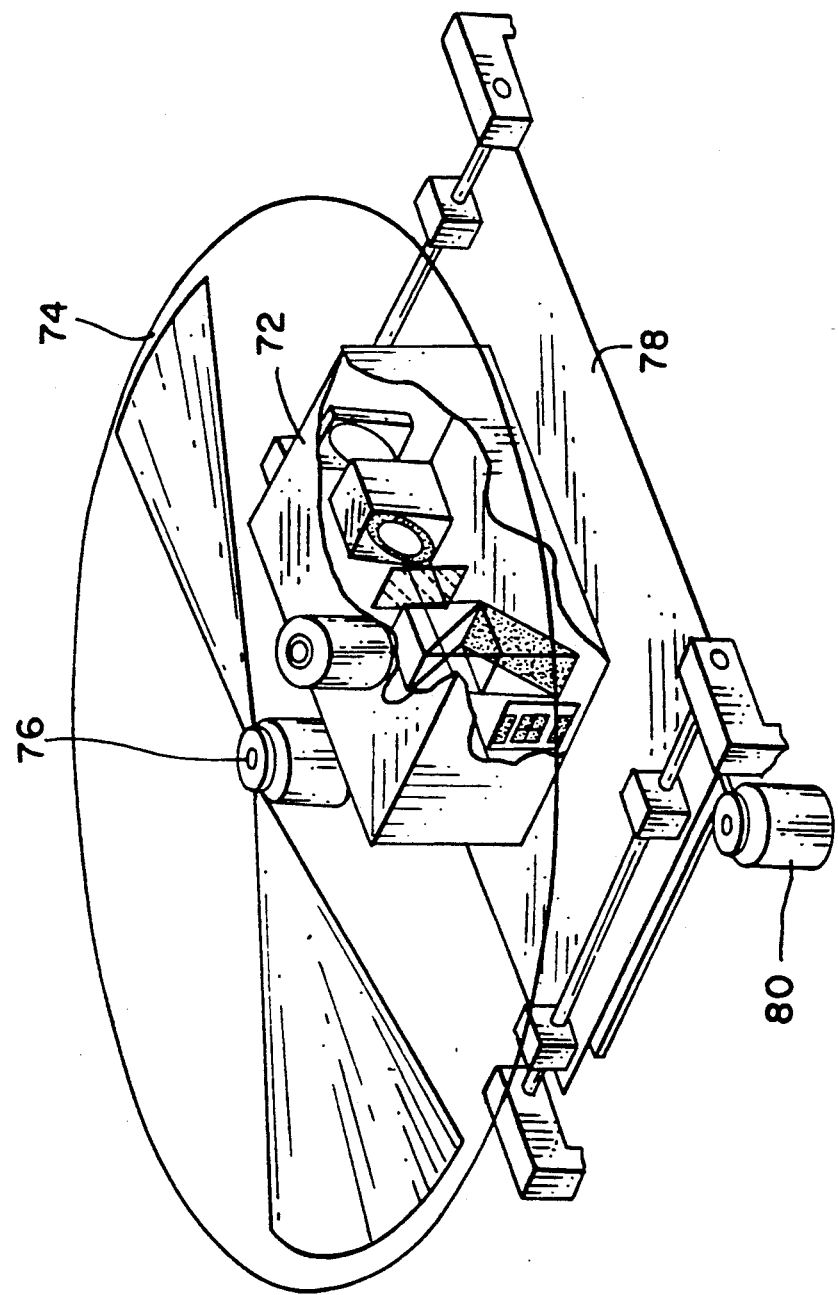
FIG. 7 is a pictorial view of a typical laser optical disk drive unit.
Figure 8:
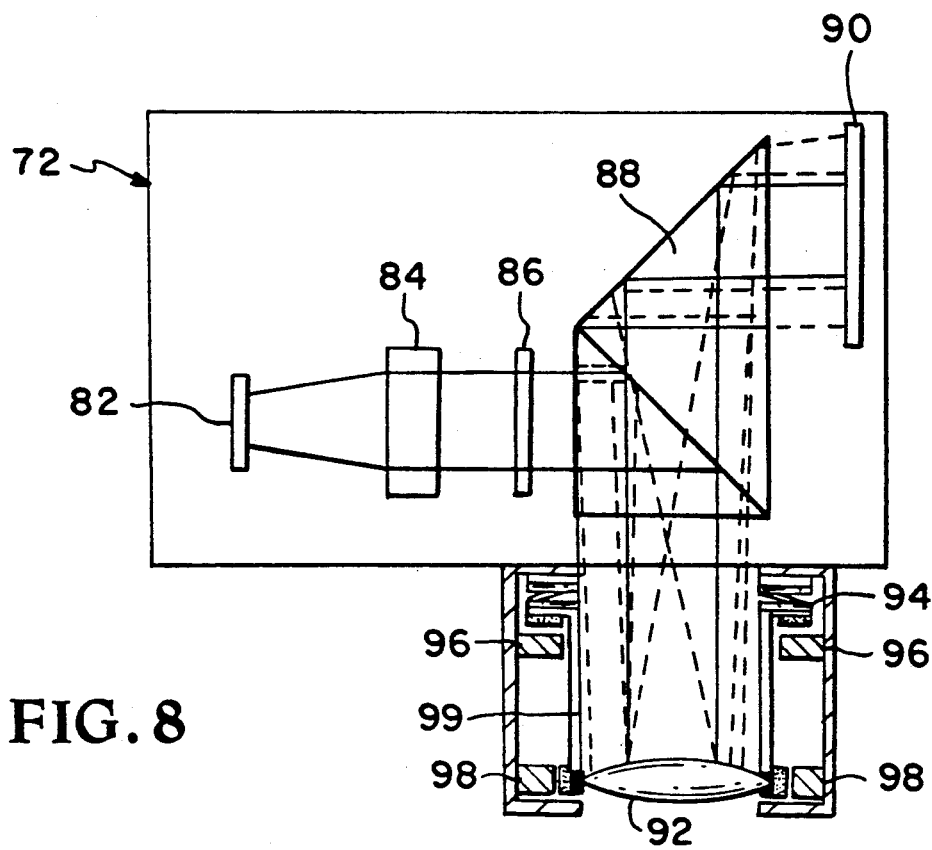
FIG. 8 is a schematic of the read/write station of a typical laser optical disk.

FIG. 7 depicts the components which comprise a typical Laser Optical Disk (LOD) drive. These include the read/write station 72, the reflective disk 74, the spindle drive mechanism 76, and the carriage 78 and its drive train 80. The read station 72 as shown in FIG. 8 includes the laser diode 82, a collimating lens 84, a diffraction grating 86, a beam splitter 88, a photo detector 90, and an objective lens 92 which is mounted on a spring diaphragm 94. The objective lens 92 is steerable via a set of magnetic coils 96 and 98 which are controlled by servo loop circuitry. The function of each of these components will be addressed in turn in the discussion which follows.

The major advantage of the LOD drive with respect to their contemporary magnetic mass storage counter parts is the high density to which information can be stored. On a standard CD one bit occupies a spot only 0.5 microns (0.00002") in diameter. These bits, or pits, are burned into the disk with a low power laser. This "burning in" of data constitutes the process of recording. The limiting factor toward making even smaller pits is the wavelength of laser light used to generate them. Currently, production devices use 760 nm laser diodes, although research toward developing smaller wavelength devices is progressing rapidly.

Figure 9:
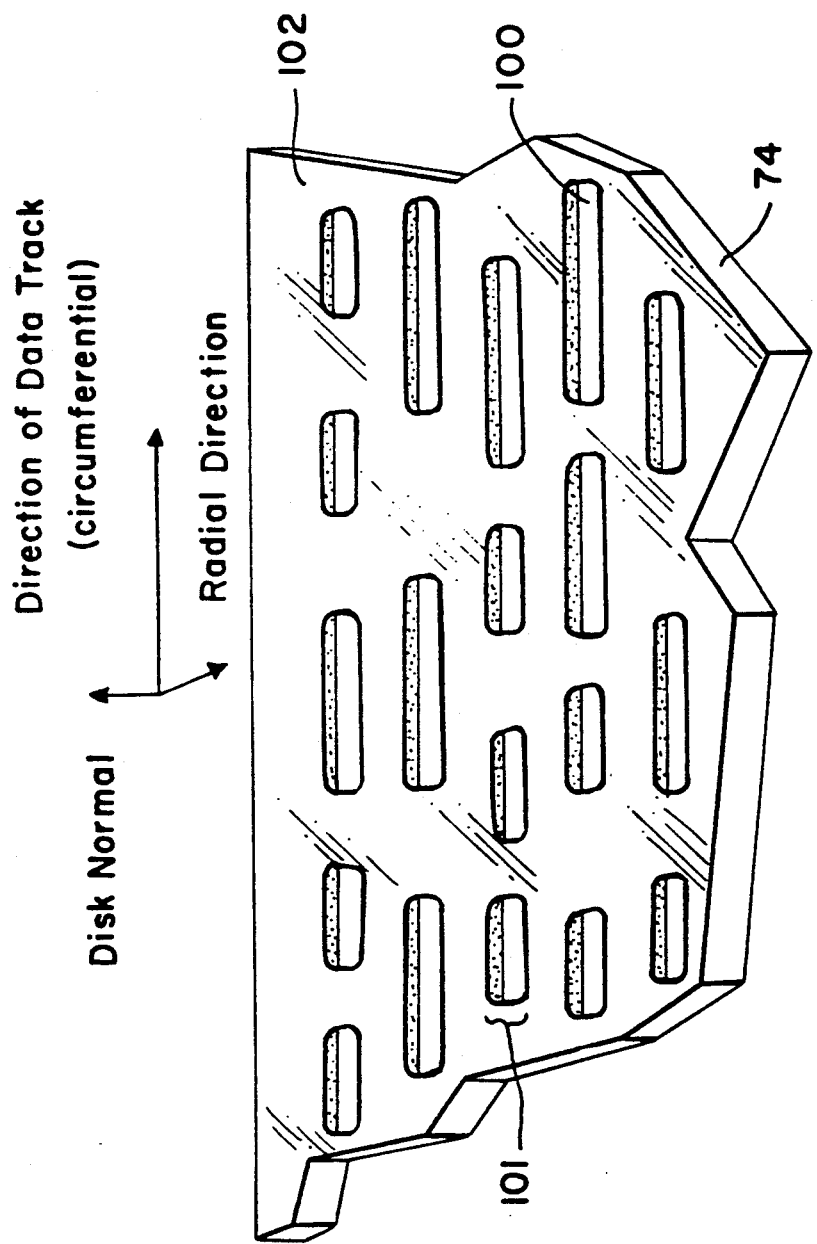
FIG. 9 is an isometric plan view of a portion of a typical optical laser disk.

FIG. 9 depicts the construction of a typical optical disk 74. In a typical recording session the disk 74 is rotated below the read/write station 72 which is shown in FIG. 8. The laser diode 82 (as shown in FIG. 8) is pulsed appropriately to lay a stream of pits 100, as shown in FIG. 9, down in either a spiral track or a series of circular tracks 101. The pits 100 have a depth of only a fraction of a wavelength of light. Once the pattern has been burned into the disk, its entire surface is coated with a thin metallic deposition. Thus, the bottoms of the pits 100 as well as the regions between the pits, or lands 102, have nearly the same reflectivity.

Figure 10:
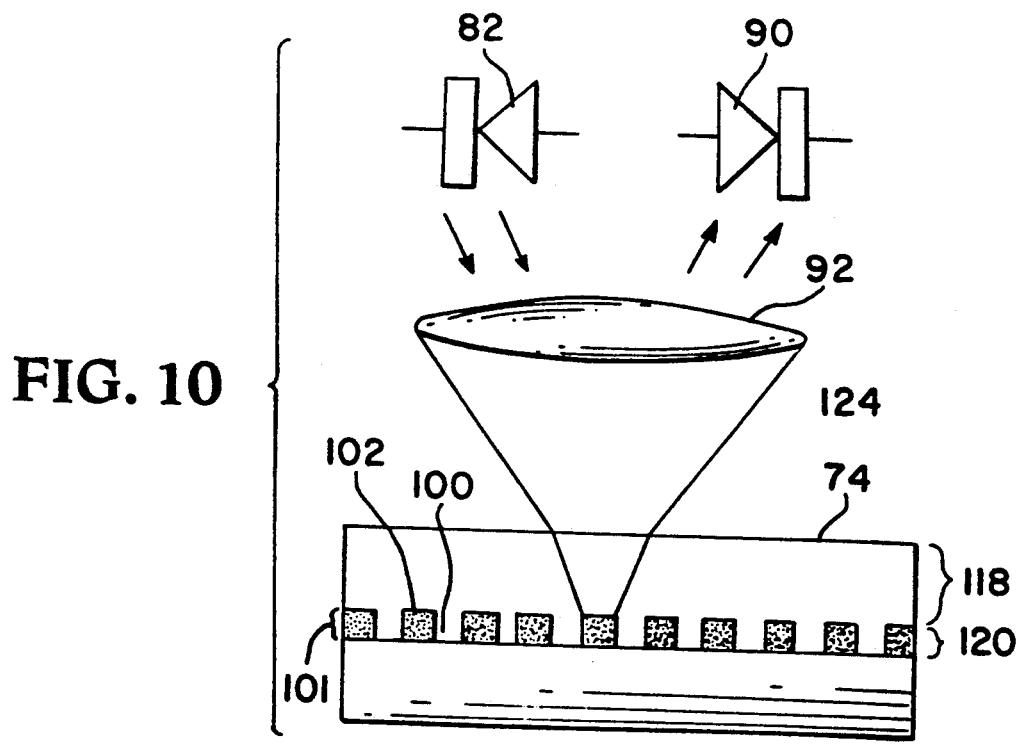
FIG. 10 is a schematic of an optical disk system using reflective optics to read data stored on a disk.

FIG. 10 depicts the manner in which the principles of interferometry are applied in order to read the data stored on the disk 74. The power to the laser diode 82 is reduced for this purpose such that it acts only as an illuminator. As the disk 74 rotates, the light from the laser diode 82 is focused via objective lens 92 onto a particular track 101 as shown in the cross-sectional view in FIG. 10. Variations in reflectivity occur at the transitions between pits 100 and lands 102 as a result of constructive interference, and these variations are sensed by a photodetector 90.

In order to keep the beam focused to the required degree, the read station of an optical disk player is equipped with servo controlled actuators. One of these moves the objective lens of the read head vertically to control focus and thereby accommodate disk warp. In order to accommodate disk wobble, a second actuator moves the objective laterally to maintain view of the track of interest at all times.

The feedback required to achieve this closed loop actuation is provided by the photodetector and is depicted in FIGS. 11a and 11b. The photodetector 90 is typically comprised of an array of four elements 104. An amorphic objective lens 92 shown in FIG. 10 is also used. Referring to FIG. 11a, when the beam is properly focused, the reflected light forms a circle 106 on the array, equally illuminating all elements 104. As the disk moves out of focus, the beam rotates and deforms into an elliptical shape 108 as depicted in FIG. 11b, or 110 as depicted in FIG. 11c. This results in an imbalance in the illumination of the array elements 104. If the disk is too far away, the ellipse 108 shown in FIG. 11b will form along one diagonal, if it is too close, the ellipse 110 shown in FIG. 11c will form along the other diagonal.

Tracking information is obtained by monitoring the signals on adjacent elements in the array as indicated in FIG. 11d. When the beam 111 is centered over the track, the elements 104 in the array are equally illuminated. As the beam 111 drifts to the left relative to the disk, the two lefthand elements 104a will see a stronger optical signal than the righthand elements 104b as depicted in FIG. 11e. The reason for this is that the elements 104b observe the edge of the pit where constructive interference occurs between the light reflected off the high and low surfaces of the disk. As the beam 111 drifts to the right relative to the disk, the two righthand elements 104b will receive a stronger optical signal than the lefthand elements 104a as depicted in FIG. 11f.

Some disks employ pre-grooves for tracking purposes. The signals resulting from diffraction at the edges of the pre-groove are balanced to maintain alignment. The data pits are actually burned into the bottom of the pre-groove. The advantage of this approach is that continuous feedback is provided independent of the presence of a pit within the field of view. The disadvantage is that constructive interference can now occur not only between pit and land, but between the top of the pre-groove and the bottom. This leads to cross-talk problems.

Figure 13:
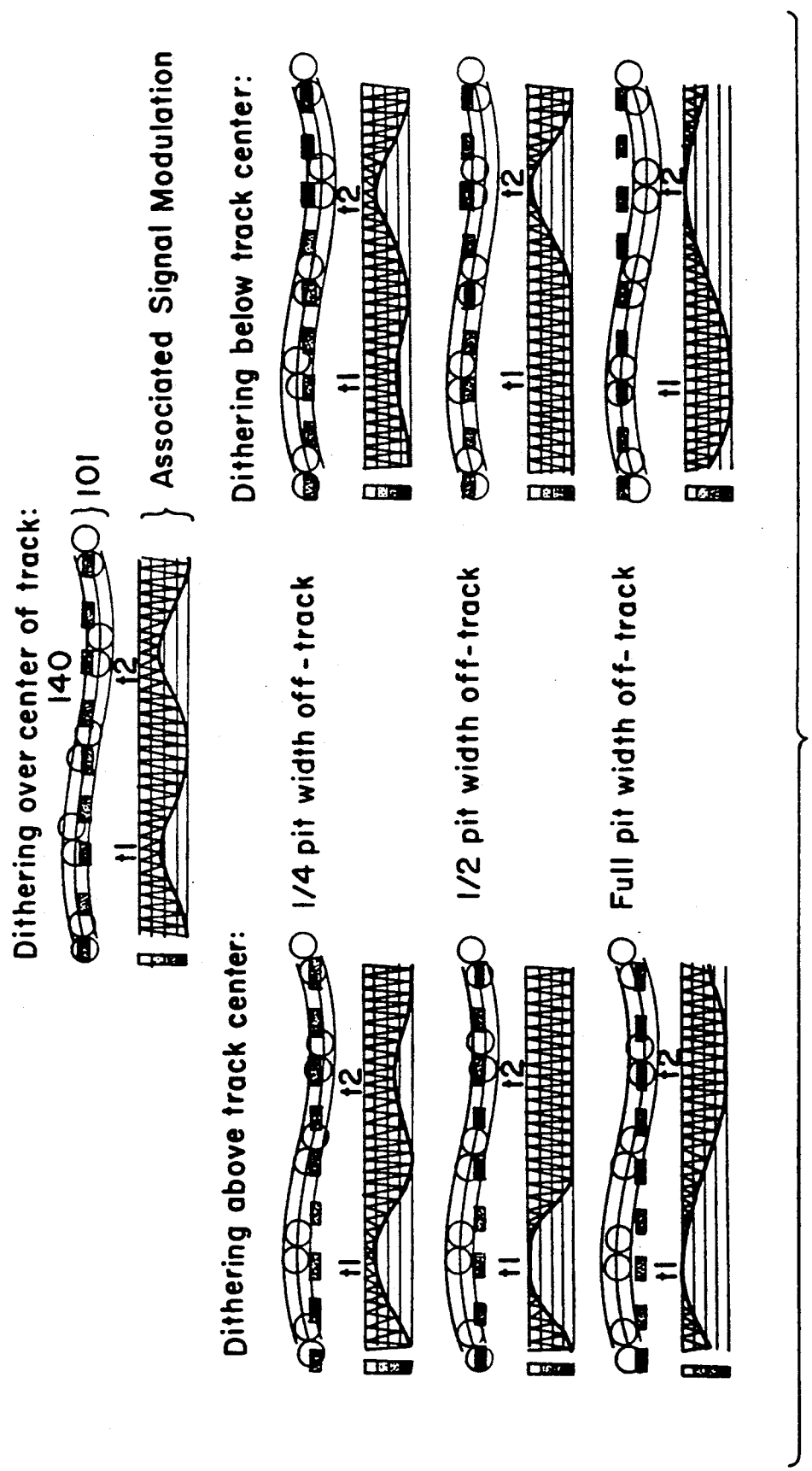
FIG. 13 depicts the dither tracking method for providing tracking feedback.

Whether a pre-groove is used or not, there are two alternative methods of providing tracking feedback which are relevant to the invention. These are the three beam tracking method as shown in FIGS. 12a, 12b and 12c and the dithering method as shown in FIG. 13. In the following paragraphs both methods are discussed assuming that a disk without pre-grooving is used.

The three beam method employs a diffraction grating 86, as shown in FIG. 8, and a six element photo detector array 112, as shown in FIGS. 12a, 12b, and 12c. Two flanking beams 144 are generated via the diffraction grating 86. They are rotated slightly out of plane such that they strike the disk along a line 114 passing through beam 140 which is skew to the direction of the data track 101 as indicated in FIGS. 12a, 12b and 12c. Aside from the four central elements 104 previously discussed, the detector array includes two outboard elements 116 which receive the reflections generated by the flanking beams 144. As the disk rotates, the amplitude of the light received by the detector fluctuates depending upon how much constructive interference occurs at a given instant. The amplitude of fluctuation associated with each of the three beams is governed by the alignment of each spot with respect to the track as indicated in FIGS. 12a, 12b and 12c. Using differential amplifiers the range of amplitude variation is compared for each spot in order to generate an appropriate feedback signal. When the degree of fluctuation over a given period of time is equal for both flanking elements 116 in the photo array 112, the device is centered as shown in FIG. 12a. When an imbalance exists between the two flanking elements 116 as shown in FIGS. 12b and 12c, the objective lens is maneuvered so as to minimize the difference in the modulation observed.

The dithering method may be used in conjunction with the methods previously described or by itself. In this method, the current to the radial servo is deliberately varied in a regular fashion. This causes the objective lens to oscillate back and forth in the radial direction. The range of amplitude fluctuation sensed by the detector rises and falls in a manner dependent upon how well the system is centered over the track 101, as indicated in FIG. 13. Note that the dither frequency is much lower than the frequency at which data is read. When the objective is perfectly centered over the rotating track, the signal modulation due to dither occurs at twice the dither frequency and the amplitudes of modulation at times t1 and t2 are equal. When the objective deviates from center, however, the amplitudes of modulation at times t1 and t2 are not equal. A feedback signal is generated by taking the difference in the amplitudes of modulation at these times. If the modulation at t1 is less than t2, the beam is tracking outboard of the data track 101. If it is greater, the beam is tracking too far inboard. Note that if the beam drifts far enough off track, a frequency shift occurs such that the frequency of the signal modulation occurs at the same frequency as the dither frequency. In this case, the phase of the signal modulation may be compared to the phase of the dither frequency in order to determine alignment, and an appropriate feedback current may be sent to the track control coils.

The active focus and tracking actuators not only accommodate warp and static wobble, but also make the device insensitive to vibration. The actuators are simple voice coil motors 96 and 98, as shown in FIG. 8, in which the objective 92 is attached to a movable bobbin 99. This bobbin 99 reacts to magnetic field variations in the surrounding control coils. It is physically connected to the surrounding structure by a spring metal diaphragm 94. There are no wear surfaces within the actuator.

In both CD players and optical disk drives, there are normally two additional drive mechanisms apart from the aforementioned focus and tracking actuators. One of these is a carriage mechanism 78 and 80, as shown in FIG. 7, to which the optical head or read/write station 72 is mounted. The carriage mechanism 78 and 80 allows the head 72 to move along the radius of the disk 74. In the CD player this is required to allow the head to follow the spiral track on the disk from beginning to end. The carriage also allows acquisition of particular tracks, or bands of tracks, enabling the user to program the order in which songs are played across the disk. In data retrieval applications wherein concentric tracks are often employed, the carriage is used to move the head to various addresses across the disk. The other mechanism contained in these devices is the spindle drive 76. The control of this drive is usually coupled to that of the other mechanisms in some manner so that the spindle drive 76 rotates the disk at an appropriate rate.

Concerns about dust and contaminants blocking the field of view of the laser are resolved in the following manner. As shown in FIG. 10, the information layer 120 is actually imbedded in the disk 74. A transparent coating 118 protects this information layer 120. The objective lens 92 within the read head is designed such that the output beam 124 strikes the disk surface 74 over a relatively large area having a diameter of approximately 0.7 mm (0.027"). As a result of the transparent coating's 118 relative index of refraction, the beam 124 converges rapidly inside the disk 74 to a spot only 1.0 micron in diameter. Thus, a particle on the surface would have to be quite large to interrupt the beam 124. In order to handle the eventuality of beam blockage, the data encoded on an optical disk 74 is usually laid out such that the input data can be reconstructed despite the loss of a bit or two.

Comparing the Two Technologies

Upon comparing the conventional optical encoder and the optical disk drive, several similarities as well as differences become apparent. Both devices use a light source and a photodetector. In the case of the encoder, the light source is typically a light emitting diode (LED), while in the optical disk drive it is a laser. Both detect the motion of a disk as changes in illumination on the photodiode. In order to function properly, both devices must maintain their internal alignments appropriately. In conventional optical encoders alignment is maintained by internal bearings and/or adjustment of the relative positions of components during their installation. In optical disk drives, alignment is achieved by means of servo actuators which constantly adjust to variations in alignment.

Both devices must contend with concerns about contamination. High resolution encoders of the conventional type rely on clean assembly at the manufacturer's facility and employ dust covers and seals to prevent contamination. Optical disk drives also employ these features but not to the same extent. This is because the optics within the optical disk drive provide a highly convergent beam which is focused below the surface of the disk. Conventional optical encoders employing the transmissive optical approach, however, use very fine collimated beams which pass directly through the disk's tiny transparent slits. These optical paths are easily blocked by small particles.

Description of Invention

The invention described herein adapts the advantages of optical disk technology toward the problem of shaft orientation sensing. Thus, the weaknesses of the conventional optical encoder are overcome. The invention employs the optical approach and disk construction of optical disk technology.

Figure 14:
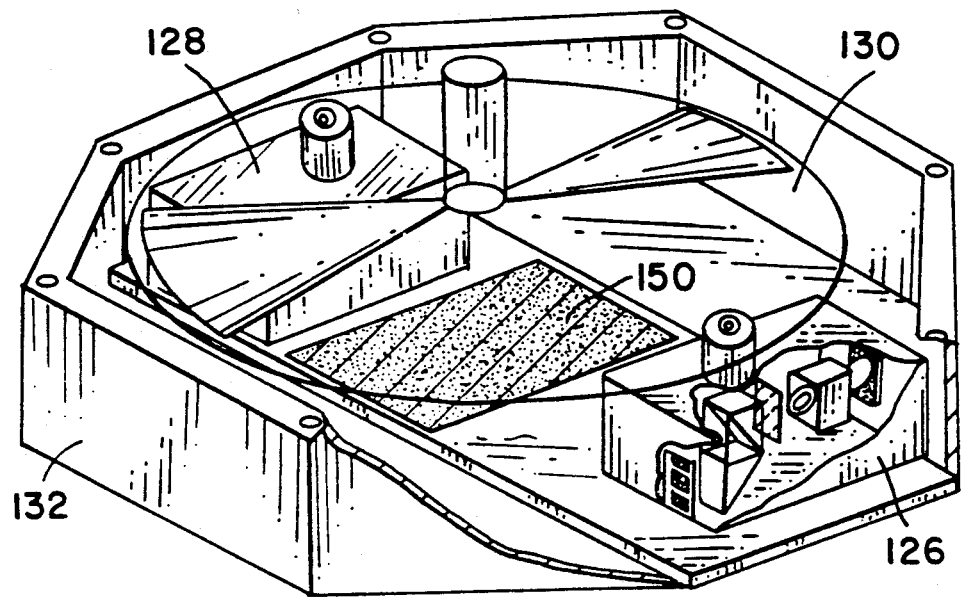
FIG. 14 depicts a pictorial view of the preferred embodiment of the invention which is a laser optical disk position encoder with two active tracking heads.

FIG. 14 depicts the components which comprise the preferred embodiment of the invention. These include the read stations 126 and 128, the disk 130, the associated electronics 150, and the encoder body 132. The read stations are of the type used in optical disk drives as illustrated in FIG. 8 and include a laser diode 82, a collimating lens 84, a diffraction grating 86, a beam splitter 88, a photo detector 90, and an objective lens 92 which is mounted on a bobbin 99 supported by a spring diaphragm 94. The objective lens 92 is steerable via a set of magnetic coils 96 and 98 which are controlled by servo loop circuitry.

Figure 15:
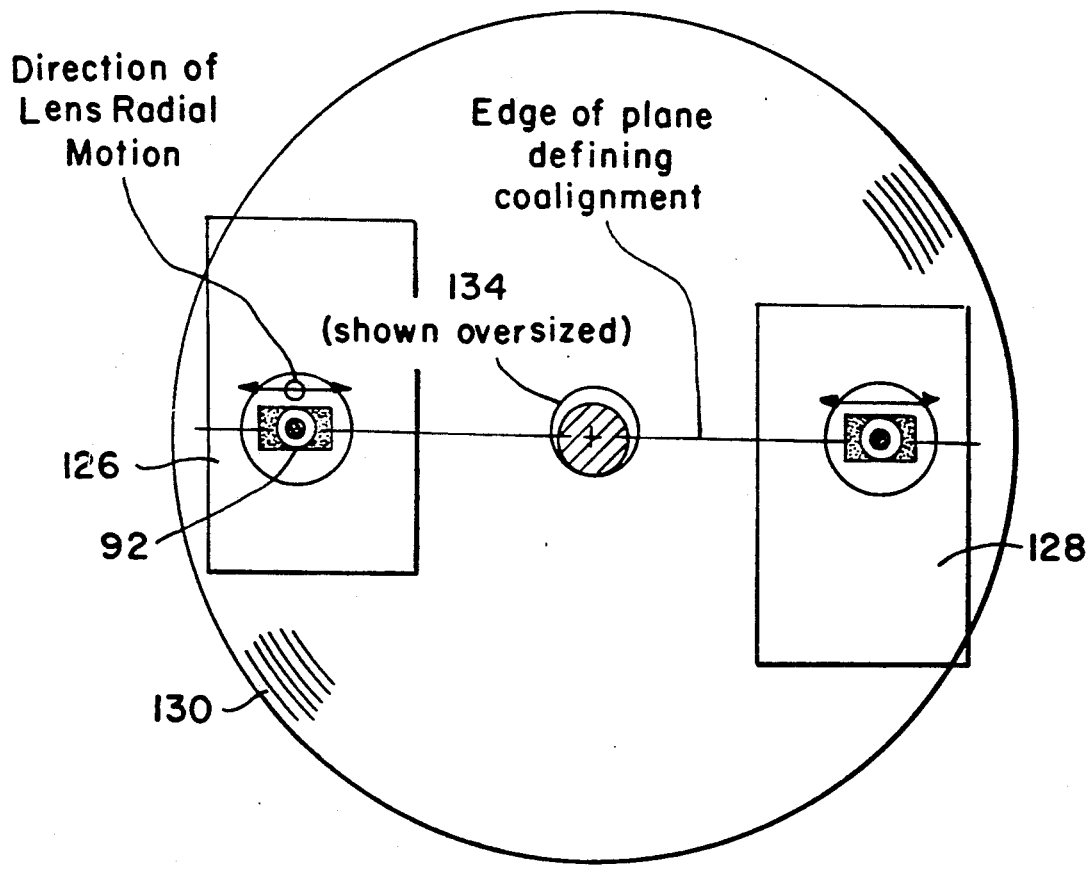
FIG. 15 is a plan view showing the read station head coalignment of the encoder shown in FIG. 14.

In the preferred embodiment of this invention as shown in FIG. 14, two read stations 126 and 128 are employed. These are positioned diametrically opposed to one another within the encoder body 132. As indicated in FIG. 15, the two are aligned such that the planes defined by the focus and track directions of motion of each set of steering optics are coplanar and such that the two are centered about the subject shaft bearing bore 134.

The read stations 126 and 128 employed are of the type described before in which a six element photo array 112, as shown in FIG. 12, and a diffraction grating 86, as shown in FIG. 8, are used. Active focus adjustment is achieved using an amorphic objective lens 92 to generate appropriate feedback signals as previously described. The radial tracking approach employed is an adaptation of the methods previously described which is designed to contend with problems peculiar to the encoder application. The tracking methods used are effective whether or not the disk used is pre-grooved.

Figure 16:
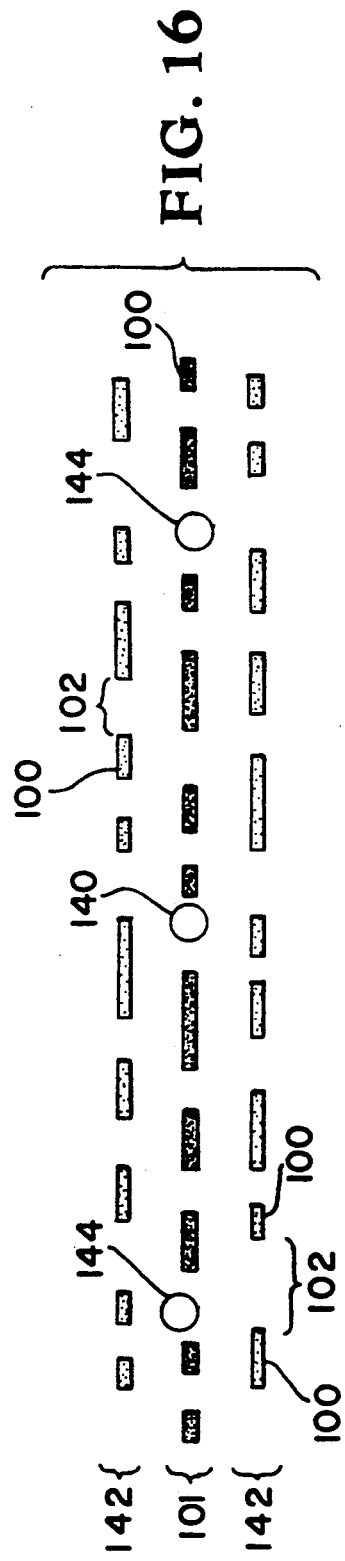
FIG. 16 is a representation of head to disk alignment with no pits in view.

In an optical disk (non pre-grooved), a portion of which is shown in FIG. 16, the proximity of the pits 100 to one another along a particular track 101 is limited by manufacturing process considerations. There are regions between pits 100, or lands 102, of greater span than the diameter of the beam 140. As the main beam 140 passes through these regions, the illumination on all four central elements of the detector is the same and no useful feedback is provided from which to derive radial position. In addition, the data patterns on optical disks in conventional applications are formatted in such a manner that the pits 100 in one track 101 are not necessarily aligned with respect to the pits 100 on neighboring tracks 142. Thus there are regions to the left and right of the track 101 where no pits 100 are visible on adjacent tracks 142. Accordingly, there are moments when the orientation of the disk relative to the read station is such that no pits 100 are visible either in the flanking beams 144 or the main beam 140 as depicted in FIG. 16. This presents a problem because in order for any of the previously described tracking methods to work, a pit 100 must be in view. Unless a pit 100 is observed, the illumination on all of the detector elements is equal regardless of radial alignment. Consequently, if the beam drifts off track where there is no pit 100, there is no useful feedback available with which to direct the head into proper alignment.

In conventional optical disk drives, this problem is addressed by rotating the disk at known constant speeds during operations. Thus, a stream of pits 100 is continually fed into the field of view of the read station. The disk is only stationary when the device is not in use. In fact, a precondition to reading or writing any data on the disk is that the disk be spun up to speed. Only then are the focus and tracking servos activated. In the event that the head loses track due to some mechanical impact to the device, the beam is swept back and forth until it intercepts a stream of pits 100.

In the generic encoder application, the device must be able to monitor disk motion whether it is rotating at high speed or stationary. It must be able to detect motion no matter what the disk's initial orientation. Consider a conventional optical disk at rest in a particular orientation in which no pits are in view such as shown in FIG. 16. Note that there are sequences of motion which can occur in which the beams 140 and 144 never intercept any pits 100. Such a condition is untenable in the encoder application because the very purpose of the device is to detect motion.

Figure 17A:
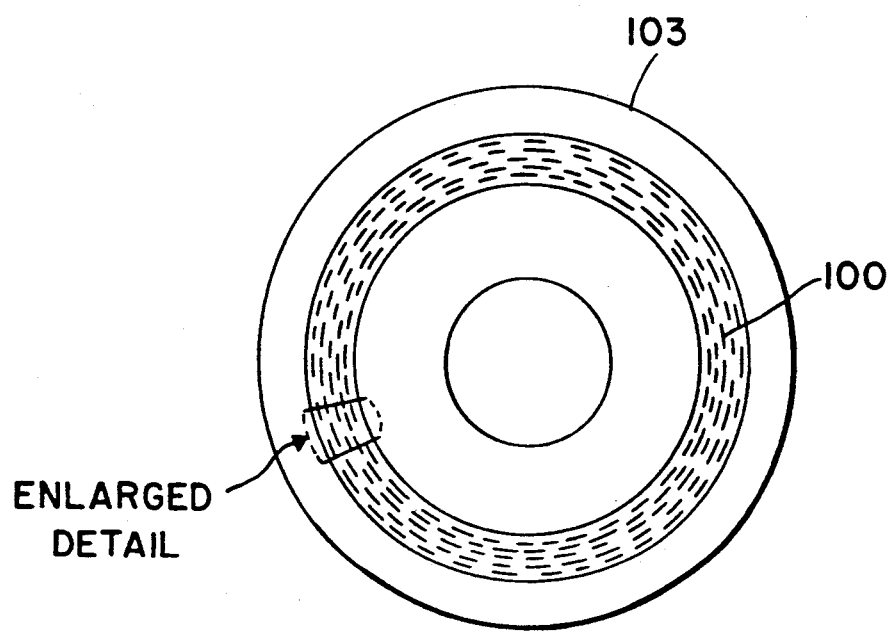
FIG. 17a is an illustration of the non pre-grooved laser optical disk employed in the preferred embodiment of the invention.
Figure 17B:
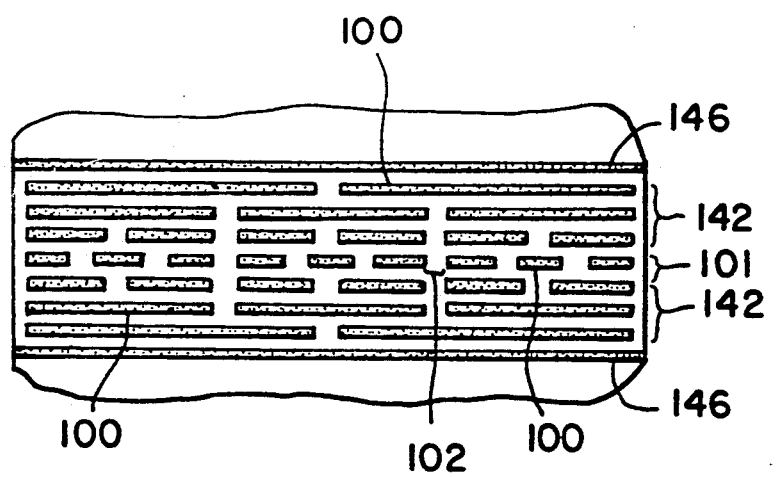

In the preferred embodiment of this invention, a non pre-grooved Laser Optical Disk (LOD) having concentric tracks of the format depicted in FIG. 17a and 17b is employed. The aforementioned difficulty is solved by using a disk pattern having pits 100 sized and positioned such that a pit 100 is always visible in either the main beam or the flanking beams. Tracking is accomplished as shown in FIG. 12 using the three beam tracking approach as the primary mode of operation and the adjacent element comparison approach as an auxiliary method of tracking as is shown in FIG. 11b.

Figure 18:
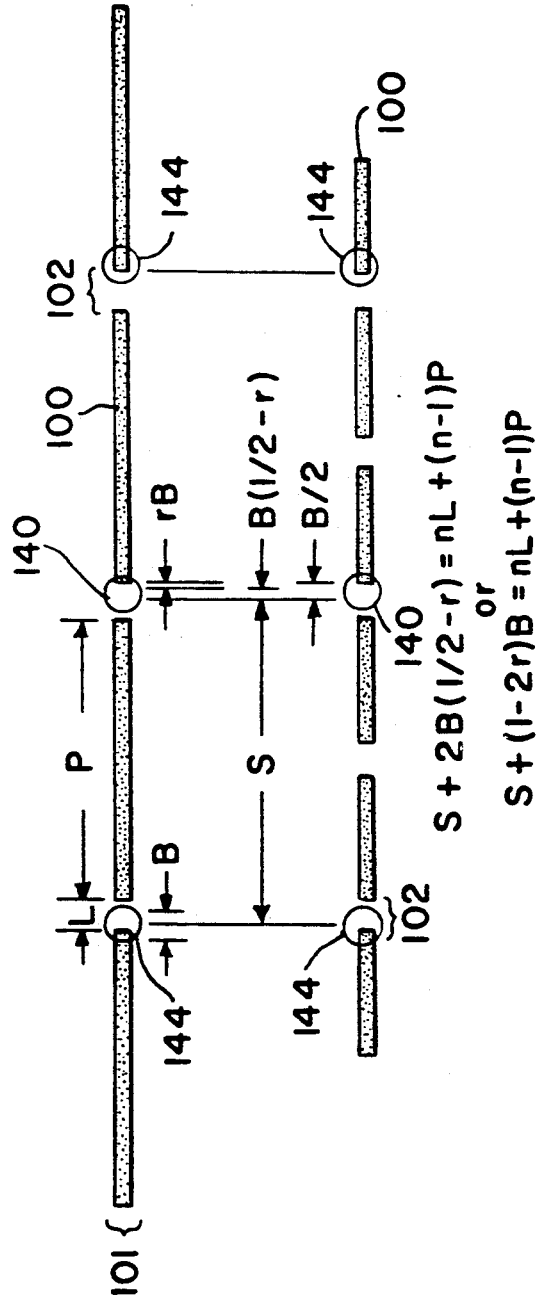
FIG. 18 shows the pit and land distribution for each data track of the preferred disk pattern for this invention.

FIG. 18 depicts the pit pattern employed in the preferred embodiment of the invention. The exact dimensions of the pits 100 and lands 102 along any given data track 101 are selected such that an even number of lands 102 and an odd number of pits 100 fall within the beam span(s) to some tolerance dependent upon photodetector sensitivities. More specifically, the pit and land dimensions for each track are determined using the following equation:

$$S+(1-2r)B=nL+(n-1)P \qquad (a)$$

where
S is the distance between the center lines of the main beam and a flanking beam,
P is the pit length,
L is the land length,
B is the beam circumference,
r is the proportion of overlap of beam and pit required to sense a change in illumination, and
n is the number of lands falling within S.

Holding to this relation ensures that when the head is centered over the track, either the main beam 140 lies over a pit 100 or the two flanking beams 144 lie over pits 100.

Figure 19:
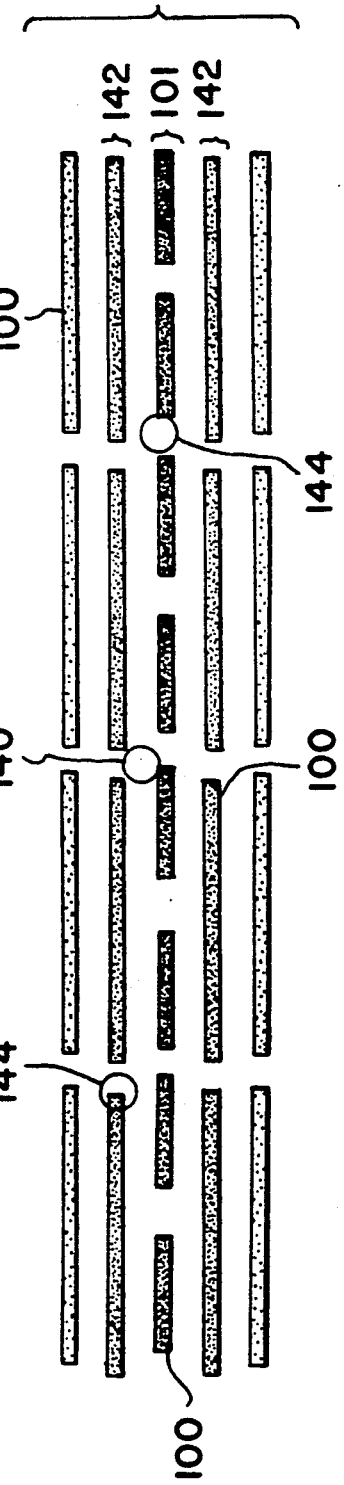
FIG. 19 is a representation of the main and flanking beams wherein the main beam is off the target track and a flanking beam has intercepted a pit on an adjacent track.

Track to track spacing and the angle of beam skew are selected such that, should the main beam 140 be off track as is shown in FIG. 19, at least one of the flanking beams 144 will intercept a pit 100 when none are visible in the main beam 140 regardless of the relative alignment of pits 100 between tracks 101 and 142.

Note that it is presumed here that $L>(1-2r)B$ due to manufacturing limitations. If $L<(1-2r)B$ there is no possibility of losing sight of a pit 100 provided the pit(s) 100 within the field of view are long enough to give a measurable change in illumination ($P>rB$).

In order to allow for acquisition of a common central track by both sets of beam steering optics, regardless of their initial radial positions, the arrangement of tracks depicted in FIG. 17b is used. On the disk 103 is a region delineated by two guard tracks 146 lying at some inner and outer diameter of the disk. These guard tracks 146 are continuous pits running the full circumference of the disk 103 and having a width on the order of the wavelength of light used in the particular setup. Within the region defined by the guard bands 146 are data tracks 101 and 142 which consist of pits 100 spaced at even intervals per the equation discussed above. The central track 101 in the region is divided into some maximum number of intervals defined by disk manufacturing limits and the photodetector feedback algorithm employed. The spacing of the intervals increases with each consecutive track as one moves from the target track 101 toward either of the two guard bands 146.

In the preferred embodiment as shown in FIG. 14, the two heads 126 and 128 are initially aligned such that the objective lens in each directs a beam onto the disk within the region defined by the guard bands 146 of FIG. 17b. The disk 103 is rotated at a constant rate or dithered about the axis of rotation. The focus servo associated with each head 126 or 128 searches for and locks onto a particular track 142 of the disk 103. Based upon the frequency of signal fluctuations received by the photo detector 90 in FIG. 8, the device identifies which track 142, shown in FIG. 17b, each head 126 or 128, shown in FIG. 14, has in view. Each beam is moved one step in the radial direction toward an adjacent track 142 as shown in FIG. 17b, and the adjacent track 142 is identified. If the frequency of the signal fluctuations associated with the adjacent track 142 is higher, the radial servo continues to step in that direction, scanning and identifying tracks until a decrease in frequency is noted. At that point it steps back to the previously identified track 101 which indicates the maximum density of pits, this being the target track 101. Once the servos within the two heads 126 and 128 have locked on to the target track 101, the track radius is fixed, known and identical for both heads 126 and 128. The radius upon which angular calculations are based does not vary as the disk wobbles, as it does for a conventional encoder with fixed read stations and broad tracks.

Once the device has been setup as described, it is used just as the conventional encoder. The variations in the two detector array signals, one coming from each read station, are averaged and interpreted as angular rotations.

Because of the unique kinematic structure of this device, it is insensitive to eccentricities and radial play under certain conditions. These conditions are attained when two diametrically opposed heads are employed, they are centered about the subject shaft bearing bore, and they are aligned such that the radial directions of motion associated with each set of steering optics are coplanar.

The preferred embodiment of this invention is modular in construction such that the disk and the encoder body have no direct physical connection. No internal bearings are used; therefore, concerns about wear and lubrication are eliminated. Greater reliability is afforded as well, and concerns about contamination in clean environments are reduced.

The device is actively self-aligning. Thus, warp and wobble in the disk are easily accommodated. External vibration, which might introduce misalignment between the encoder body and the disk, is also accommodated through the use of the focus and tracking actuators. This feature taken with the modular construction results in an encoder which is tolerant of external loads in general.

Despite the fact that the read stations are now mechanized, reliability is not reduced substantially because the actuators are flexure mounted. There are no wear surfaces introduced by this additional mechanization. In this application there is no need for the heads to be carriage mounted as they are in a CD player or optical disk drive. The disk employs concentric rather than spiral tracks and each head is only required to acquire a track within the narrow range defined by the guard bands. The fine track actuator in an optical read head is capable of covering a range of 0.7 mm (0.027"). At initial assembly it should not be difficult to align the disk relative to the head such that the track, or tracks, of interest fall within this range. In this application there is no platter drive mechanism to be concerned with either. The disk will be attached to a shaft whose orientation and rate of rotation are user application dependent.

Through the use of the Laser Optical Disk (LOD), two important features are gained. First, because a laser is used to encode the disk, much smaller markings may be encoded on the disk. A much higher resolution is therefore obtainable for an encoder of a given diameter. Current photolithographic techniques yield a minimum slit size of 0.0001" while the smallest pits that can be burned into an optical disk are only 0.00002" across. Thus, a 5 fold increase in mechanical resolution is possible. As recording techniques and materials are refined in the various types of mass media, this encoder concept may be adapted to the media offering the greatest bit density. So even higher resolutions may be feasible. The second advantage afforded by using the optical disk along with the associated optics is that the disk is more tolerant of contamination and physical abuse. This is due to the convergent optical path and the fact that the information layer is within the disk rather than on the surface.

Alternative Embodiments of the Invention

Other embodiments of this invention are also possible. For example, more than two read stations may be employed to increase the fidelity of the averaged motion sensed.

Also orthogonal read stations are possible, wherein alternative arrangements of the invention include variations in the relative orientation and positioning of the read stations. Two read stations may be placed orthogonal to one another such that the objective lenses of each move perpendicular to one another as they compensate for disk wobble. In such an arrangement, the motion of the each objective lens in the radial and focal directions is measured either by measuring the current required to keep the head on track, or by using displacement sensors placed within each read station for this purpose. In this way a particular installation of the device on a subject shaft could be characterized in terms of eccentricity, radial play and axial play. Knowledge of eccentricity may be used to infer orientation of the disk should loss of count occur due to power failure.

By providing the angular orientation sensing device as is disclosed herein, utilizing optical disk technology with actively tracking read stations toward the angle encoding application, it is now possible to construct an encoder which offers numerous potential advantages over encoders of conventional design. These have been cited above.

While the position encoder with moving heads of the present invention has been described in considerable detail, it is understood that various changes and modifications may occur to persons of ordinary skill in the art without departing from the spirit and scope of the invention as defined in the appended claims.

What is claimed is:

1. An encoder employing constructive interferometry comprising:
    a code disk rotatable about an axis in a plane and having a plurality of bi-level surfaces spaced equidistantly apart by a predetermined pitch on a circumferential part of one face of said disk in said rotation plane, said bi-level surfaces extending circumferentially about said rotation axis wherein said bi-level surfaces have a uniform reflectivity, said bi-level surfaces lying in one of either of two parallel planes differing in elevation by a fraction of a wavelength of light; and
    sensing means disposed opposite said circumferential part of said one face of said code disk and facing said bi-level surfaces, wherein said sensing means are kinematically mounted allowing motion with respect to said one face of said disk thereby allowing said sensing means to acquire and continually track said bi-level surfaces, and wherein the position and orientation of said sensing means are established through closed loop control circuitry capable of evaluating the relative position and orientation of said sensing means with respect to said bi-level surfaces.

2. An encoder employing constructive interferometry comprising:
    a code disk rotatable about an axis in a plane and having a plurality of bi-level surfaces spaced equidistantly apart by a predetermined pitch on a circumferential part of one face of said disk in said rotation plane, said bi-level surfaces extending circumferentially about said rotation axis wherein said bi-level surfaces have a uniform reflectivity, said bi-level surfaces lying in one of either of two parallel planes differing in elevation by a fraction of a wavelength of light;
    sensing means disposed opposite said circumferential part of said one face of said code disk and facing said bi-level surfaces, wherein said sensing means are kinematically mounted allowing motion with respect to said one face of said disk thereby allowing said sensing means to acquire and continually track said bi-level surfaces, and wherein the position and orientation of said sensing means are established through closed loop control circuitry capable of evaluating the relative position and orientation of said sensing means with respect to said bi-level surfaces;
    said sensing means further comprises:
    transmitter means for directing a coherent light beam through an aperture toward said one face of said code disk;
    receiver means for detecting the light reflected off said one face of said code disk;
    electronic circuitry for evaluating the detected light thereby interpreting the distance between said code disk and beam steering optics located within said head sensing means, the focus parameter, and also interpreting the track position of said code disk relative to said aperture, the radial track parameter, said circuitry having the capability of producing error signals proportional to both said parameters; and
    servo controlled means for directing said beam steering optics so as to follow both axial variations and radial motion of said code disk, wherein said focus and tracking error signals are fed back to said servo controlled means for correction of said beam steering optical device.

3. The apparatus recited in claim 2 wherein said sensing means incorporates additional sensors which measure the relative position of the objective lens in the radial and axial directions in order to provide additional feedback which is suitable for characterizing the eccentricity, radial play and axial play present in a particular installation.

4. The apparatus recited in claim 2 wherein said sensing means includes at least two read/write stations that are located diametrically opposed from one another.

5. The apparatus recited in claim 2 wherein said code disk is a laser optical disk.

6. The apparatus recited in claim 5 wherein said application of constructive interferometry comprises:
  means for directing a coherent light beam onto said bi-level surfaces of said disk;
  means for collimating said light beam;
  beam splitter means for reflecting said collimated coherent light beam onto said bi-level surfaces of said disk; and
  means for detecting said light beam after said light beam is reflected back from said bi-level surfaces from said disk and after said light beam again passes through said beam splitter means.

7. An encoder comprising:
  a code disk rotatable about an axis in a plane and having a plurality of demarcated elements spaced equidistantly apart by a predetermined pitch on a circumferential part of one face of said code disk in said rotation plane, said demarcated elements extending circumferentially about said rotation axis; and
  sensing means disposed opposite said circumferential part of said one face of said code disk facing said bi-level surfaces, wherein said sensing means are kinematically mounted allowing motion with respect to said one face of said code disk thereby allowing said sensing means to acquire and continually track said demarcated elements, and wherein the position and orientation of said sensing means are established through closed loop control circuitry capable of evaluating the relative position and orientation of said sensing means with respect to said demarcated elements.

8. The apparatus recited in claim 7 wherein said code disk is a magnetic disk.

9. The apparatus recited in claim 7 wherein said code disk is a magneto-optic disk.

10. The apparatus recited in claim 7 wherein said code disk is a electron trapping optical disk.

11. A method for the application of angular position sensing comprising the steps of:
  (a) aligning a beam steering optical system located within a read station such that said system directs a coherent beam of light so that said light strikes a code disk within a defined band of tracks;
  (b) rotating said code disk at a constant rate;
  (c) activating a first magnetic actuator to move an objective lens located within said beam steering optical system such that the light beam is focused upon an information layer within said code disk, and constantly maintaining the distance between said objective lens and said information layer of said code disk;
  (d) activating a second magnetic actuator to move said objective lens such that said light beam is centered above the closest track located within said band of tracks of said code disk;
  (e) evaluating the optical signal received by a detector located within said read station to determine the frequency of variation of the optical signal received by said detector as a result of said disk motion;
  (f) repeating steps (d) and (e) for the adjacent tracks of said code disk until the track with the highest frequency of variation of the optical signal received by said detector is located;
  (g) maintaining the radial alignment of said objective lens relative to said track; and
  (h) monitoring the optical signal received by said detector to determine relative changes in angular orientation of said disk.

12. A method for the application of angular position sensing comprising the steps of:
  (a) aligning a beam steering optical system located within a read station such that said system directs a coherent beam of light so that said light strikes a code disk within a defined band of tracks;
  (b) dithering said code disk at a constant frequency;
  (c) activating a first magnetic actuator to move an objective lens located within said beam steering optical system such that the light beam is focused upon an information layer within said code disk, and constantly maintaining the distance between said objective lens and said information layer of said code disk;
  (d) activating a second magnetic actuator to move said objective lens such that said light beam is centered above the closest track located within said band of tracks of said code disk;
  (e) evaluating the optical signal received by a detector located within said read station to determine the frequency of variation of the optical signal received by said detector as a result of said disk motion;
  (f) repeating steps (d) and (e) for the adjacent tracks of said code disk until the track with the highest frequency of variation of the optical signal received by said detector is located;
  (g) maintaining the radial alignment of said objective lens relative to said track; and
  (h) monitoring the optical signal received by said detector to determine relative changes in angular orientation of said disk.

* * * * *